(12) United States Patent
Rosenbaum et al.

(10) Patent No.: US 7,259,634 B2
(45) Date of Patent: Aug. 21, 2007

(54) ARRANGEMENT AND METHOD FOR DIGITAL DELAY LINE

(75) Inventors: Yair Rosenbaum, Hod Asharon (IL); Shai Sade, Bat-Yam (IL); Sergey Sofer, Rishon Lezion (IL); Emil Yehushua, Kiryat-Ono (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/872,066

(22) Filed: Jun. 18, 2004

(65) Prior Publication Data

US 2004/0263266 A1 Dec. 30, 2004

(30) Foreign Application Priority Data

Jun. 30, 2003 (GB) ................... 0314193.4

(51) Int. Cl.
*H03B 27/00* (2006.01)
(52) U.S. Cl. .................. 331/57; 331/46; 331/2
(58) Field of Classification Search ............. 331/57, 331/46, 2
See application file for complete search history.

(56) References Cited

U.S. PATENT DOCUMENTS

| 4,675,562 | A | 6/1987 | Herlein |
| 5,771,264 | A | 6/1998 | Lane |
| 5,923,715 | A | 7/1999 | Ono |
| 5,949,292 | A * | 9/1999 | Fahrenbruch et al. ......... 331/57 |
| 5,973,507 | A | 10/1999 | Yamazaki |
| 6,140,854 | A | 10/2000 | Coddington et al. |
| 6,337,590 | B1 | 1/2002 | Millar |
| 6,373,308 | B1 | 4/2002 | Nguyen |
| 6,791,422 | B2 * | 9/2004 | Staszewski et al. ....... 331/36 C |
| 2003/0095009 | A1 | 5/2003 | Gomm |

FOREIGN PATENT DOCUMENTS

| EP | 0613246 B1 | 7/1997 |
| EP | 0967724 B1 | 8/2005 |

OTHER PUBLICATIONS

Combined Search and Examination Report for GB0314193.4.

* cited by examiner

*Primary Examiner*—Joseph Chang

(57) ABSTRACT

An arrangement (100) and method for a high precision and low distortion digital delay line with infinite delay. The digital delay line has an oscillating ring (110) with an odd number of inverting elements that triggers a counter (120). A comparator (130) compares the counter and the MSB of a given delay word. A line of inverters (150–159), double the odd number in the ring oscillator, is connected to a MUX (160) controlled by the LSB of the delay word.

This provides the advantages of: high resolution due to use of a small, basic component, self-delay ring oscillator; small silicon area due to use of a special decoding scheme use the rings number to produce large delays; and easy implementation as a digital block in an integrated circuit using a standard cells library to build the ring and the decoder.

16 Claims, 1 Drawing Sheet

ARRANGEMENT AND METHOD FOR DIGITAL DELAY LINE

FIELD OF THE INVENTION

This invention relates to digital delay lines, and particularly (though not exclusively) to digital delay lines which provide long (commonly termed 'infinite') delay while maintaining high delay resolution and low distortion.

BACKGROUND OF THE INVENTION

In the field of this invention it is known that typically in a digital delay line the signal to be delayed is propagated through a line of inverters and a multiplexer (MUX) to select the location (inverter) at which the signal will be output.

However, this approach has the disadvantage(s) that traditionally a digital delay line with high resolution and long delay occupies a big silicon area of an integrated circuit. In order to build a long digital delay line with small silicon area, the resolution must be decreased. In addition, the signal to be delayed is distorted as more as the delay line becomes longer.

A need therefore exists for an arrangement and method for a digital delay line with infinite delay wherein the above-mentioned disadvantage(s) may be alleviated.

STATEMENT OF INVENTION

In accordance with a first aspect of the present invention there is provided a for a digital delay line arrangement as claimed in claim 1.

In accordance with a second aspect of the present invention there is provided a digital delay line method as claimed in claim 11.

BRIEF DESCRIPTION OF THE DRAWING

One arrangement and method for a high precision and low distortion digital delay line with infinite delay incorporating the present invention will now be described, by way of example only, with reference to the accompanying drawing, in which.

DESCRIPTION OF PREFERRED EMBODIMENT

Figure 1:
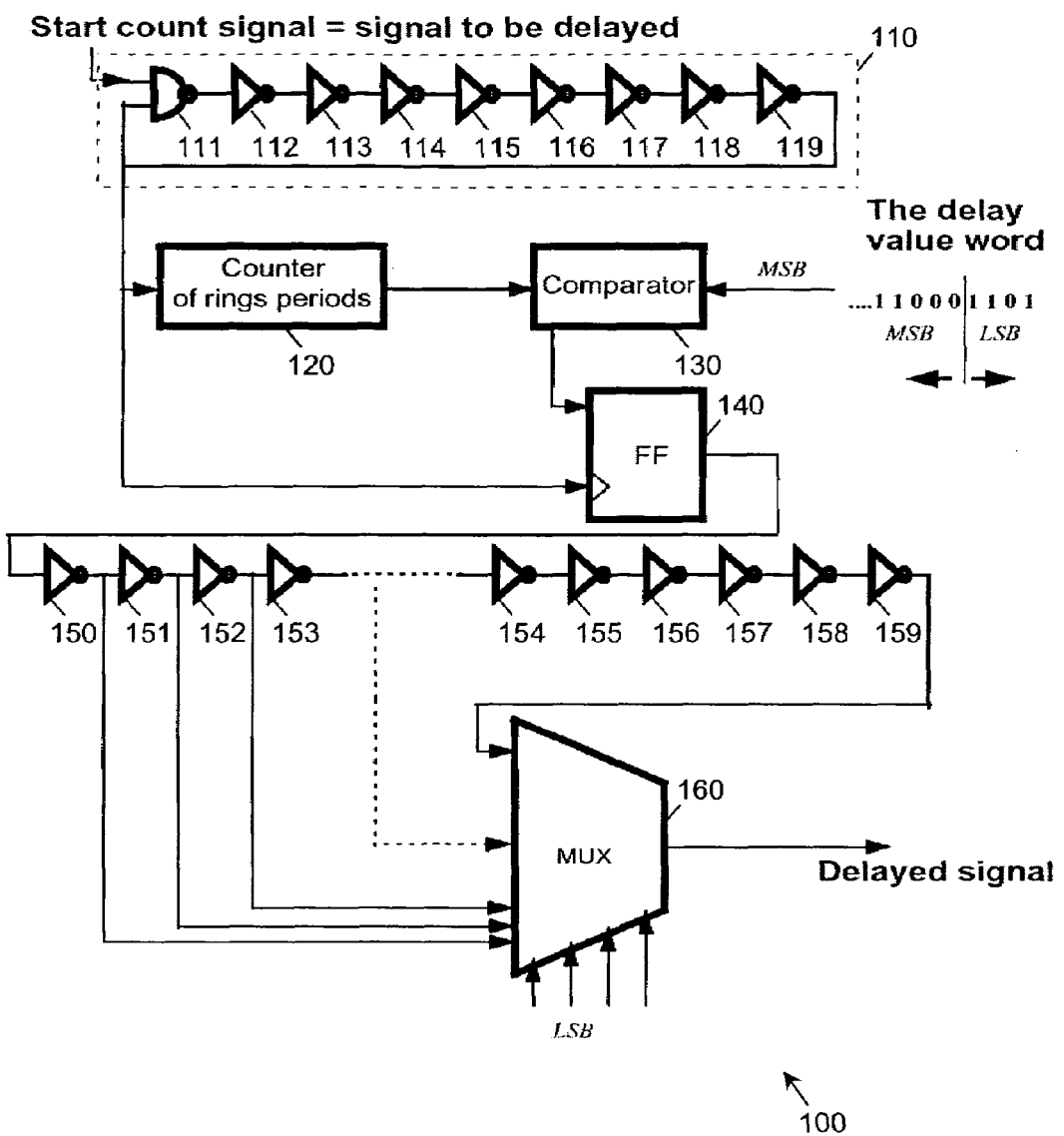
FIG. 1 shows a block schematic diagram of illustrating a ring-based digital delay line incorporating the present invention.

The infinite delay, high precision and low distortion digital delay line arrangement 100 includes a ring oscillator 110 constituted by an inverting AND gate 111 having an input for receiving a start count signal, i.e., the signal to be delayed. The output of the AND gate 111 is connected to a serially-coupled line of inverters 112–119, the output of the inverter 119 being connected to another input of the AND gate 111 and to the output of the oscillator.

The output of the oscillator is connected to a counter 120. The output of the counter is connected to an input of a comparator 130, of which another input is arranged to receive the most significant bits (MSB) of a binary word constituting the delay value. The output of the comparator 130 is connected to the data input of a flip-flop 140, whose clock input is connected to the output of the oscillator 110.

The output of the flip-flop 140 is connected to a line of serially coupled inverters, of which ten (150–153 and 154–159) are shown. The output of the inverter 159, together with outputs of others of the inverters, are connected to respective inputs of a multiplexer 160. Control inputs of the multiplexer are connected to receive the four least significant bits (LSB) of the delay value word. The output of the multiplexer 160 is connected to the output of the delay line arrangement, from which the delayed signal is produced.

In use, the delay line arrangement of FIG. 1 operates as follows:

A start count signal, that is actually the edge of the signal to be delayed, is applied to the AND gate of the ring oscillator 110 and enables the ring to start oscillating. The number of taps to delay is the input word that should be ready before the counting starts.

The counter 120 counts the number of ring periods and this number is compared, in the comparator 130, with the MSB of the delay value word. When the number of ring periods is equal to the MSB of the delay value word, the second stage of the arrangement is activated and a signal is propagated through the line of inverters 150–159 and the MUX 160, controlled by the LSB of the delay value word, selects the delay point.

It will be appreciated that the ring oscillator 110 uses an odd number (nine) of inverting elements in order for the ring to oscillate (a ring of an even number of inverter elements would have a stable state and would not oscillate). Thus, (i) when the upper input of the NAND gate 111 is set to ZERO the output is stable as ONE (regardless of the NAND gate's lower input) and the ring is in stable mode and will not oscillate, and (ii) when the upper input to the NAND gate changes to ONE the ring will start to oscillate (the NAND gate being logically equal to an inverter because the NAND gate's lower input determines the output).

It will also be appreciated that the line of inverters 150–159 uses a number of inverters equal to 2^LSB (LSB being the number of LSB control bits applied to the MUX 160), which in the present case is 2^4=16.

It will be understood that this combination of ring 110, counter 120 and inverter line 150–159 allows any desired delay to be provided. Considering, for example, a ring of 7 inverter elements and a line of 16 inverters. If it is desired to have a delay of 53 (00110101) inverter delays then the LSB is 0101 and the MSB is 0011. Since every ring cycle is 14 and not 16 delay units, and since the MSB is 3, then 3*(16−14) should be added to the desired delay value 53 so that the new delay is 59 which is (00111011); now if the ring oscillates for 0011 (MSB) cycles and the MUX will select the $1011^{th}$ (LSB) element then the resultant delay will be 3*14+11=53 cycles. All the calculation is done before the delay starts, so once the desired delay is known the delay line will be given a different number that will produce the resultant desired delay.

It will be understood that the digital delay line scheme described above allows a high precision and low distortion digital delay line with infinite delay to be provided.

It will also be understood that, compared with previous clocking schemes which (i) use a clock of high frequency requiring high-resolution delay regulation with big total delay and (ii) occupy large large silicon area and introduce significant signal distortion, the digital delay line scheme described above allows both of these problems to be solved as follows:

high resolution is obtained through use of the ring oscillator, a small self-delay basic component.

small silicon area is obtained through use of the decoding scheme using the rings number to produce large delays.

It will be further understood that the digital delay line scheme described above can be easily implemented as a digital block in integrated circuit design using a standard cells library for building the ring and the decoder (although some pre-placements may be needed).

The invention claimed is:

1. A digital delay line arrangement, comprising:
   a first stage arranged to produce a first output signal with a delay determined by a first part of a delay word value; and
   a second stage coupled to receive the first output signal from the first stage and arranged to produce a second output signal with a delay determined by a second part of the delay word value, one of the first and second stages having ring oscillator means, wherein the first stage comprises:
   ring oscillator means;
   counter means arranged to count oscillations of the ring oscillator means; and
   comparator means for comparing the counter means value with the first part of the delay word value to produce the first output signal.

2. A digital delay line arrangement, comprising:
   a first stage arranged to produce a first output signal with a delay determined by a first part of a delay word value; and
   a second stage coupled to receive the first output signal from the stage and arranged to produce a second output signal with a delay determined by a second part of the delay word value,
   one of the first and second stages having ring oscillator means; wherein the second stage comprises:
   inverter means arranged to receive the first output signal and having a plurality of serially-coupled inverter elements; and
   multiplexer means having inputs connected respectively to outputs of predetermined ones of the plurality of inverter elements of the inverter means, having a control input arranged to receive the second part of the delay word value, and having an output for producing the second output signal.

3. A digital delay line arrangement, comprising:
   a first stage arranged to produce a first output signal with a delay determined by a first part of a delay word value; and
   a second stage coupled to receive the first output signal from the first stage and arranged to produce a second output signal with a delay determined by a second part of the delay word value,
   one of the first and second stages having ring oscillator means; wherein the first and second parts of the word value are respectively most and least significant parts of the word value.

4. A digital delay line arrangement, comprising:
   a first stage arranged to produce a first output signal with a delay determined by a first part of a delay word value; and
   a second stage coupled to receive the first output signal from the first stage and arranged to produce a second output signal with a delay determined by a second part of the delay word value,
   one of the first and second stages having ring oscillator means; wherein the ring oscillator means is arranged to be enabled by a signal to be delayed.

5. The digital delay line arrangement of claim 2 wherein the number of serially-coupled inverter elements in the inverter means is two to the power of the number of bits in the second part of the word value.

6. The digital delay line arrangement of claim 2, further comprising flip-flop means coupled between the first stage and the second stage.

7. The digital delay line arrangement of claim 6, wherein the flip-flop means has a data input arranged to receive the first output signal and a clock input arranged to receive the ring oscillator means output.

8. A digital delay line arrangement, comprising:
   a first stage arranged to produce a first output signal with a delay determined by a first part of a delay word value; and
   a second stage coupled to receive the first output signal from the first stage and arranged to produce a second output signal with a delay determined by a second part of the delay word value,
   one of the first and second stages having ring oscillator means; wherein the second part of the word value comprises four bits.

9. A digital delay line method, comprising:
   providing a first stage arranged to produce a first output signal with a delay determined by a first part of a delay word value; and
   providing a second stage coupled to receive the first output signal from the first stage and arranged to produce a second output signal with a delay determined by a second part of the delay word value, one of the first and second stages having ring oscillator means:
   wherein the first stage comprises:
   ring oscillator means;
   counter means counting oscillations of the ring oscillator means; and
   comparator means comparing the counter means value with the first part of the delay word value to produce the first output signal.

10. A digital delay line method, comprising;
    providing a first stage arranged to produce a first output signal with a delay determined by a first part of a delay word value; and
    providing a second stage coupled to receive the first output signal from the first stage and arranged to produce a second output signal with a delay determined by a second part of the delay word value, one of the first and second stages having ring oscillator means;
    wherein the second stage comprises:
    inverter means receiving the first output signal and having a plurality of serially-coupled inverter elements; and
    multiplexer means having inputs connected respectively to outputs of predetermined ones of the plurality of inverter elements of the inverter means, having a control input receiving the second part of the delay word value, and having an output producing the second output signal.

11. A digital delay line method, comprising:
    providing a first stage arranged to produce a first output signal with a delay determined by a first part of a delay word value; and
    providing a second stage coupled to receive the first output signal from the first stage and arranged to produce a second output signal with a delay determined by a second part of the delay word value, one of the first and second stages having ring oscillator means; wherein the first and second parts of the word value are respectively most and least significant parts of the word value.

12. A digital delay line method, comprising:
providing a first stage arranged to produce a first output signal with a delay determined by a first part of a delay word value; and
providing a second stage coupled to receive the first output signal from the first stage and arranged to produce a second output signal with a delay determined by a second part of the delay word value, one of the first and second stages having ring oscillator means; wherein the ring oscillator means is enabled by a signal to be delayed.

13. The method of claim 10, wherein the number of serially-coupled inverter elements in the inverter means is two to the power of the number of bits in the second part of the word value.

14. The method of claim 10, further comprising providing flip-flop means coupled between the first stage and the second stage.

15. The method of claim 14, wherein the flip-flop means has a data input receiving the first output signal and a clock input receiving the ring oscillator means output.

16. A digital delay line method, comprising:
providing a first stage arranged to produce a first output signal with a delay determined by a first part of a delay word value; and
providing a second stage coupled to receive the first output signal from the first stage and arranged to produce a second output signal with a delay determined by a second part of the delay word value, one of the first and second stages having ring oscillator means; wherein the second part of the word value comprises four bits.

* * * * *

UNITED STATES PATENT AND TRADEMARK OFFICE
CERTIFICATE OF CORRECTION

PATENT NO. : 7,259,634 B2  
APPLICATION NO. : 10/872066  
DATED : August 21, 2007  
INVENTOR(S) : Yair Rosenbaum Page 1 of 1

It is certified that error appears in the above-identified patent and that said Letters Patent is hereby corrected as shown below:

In Column 3, Line 28, Claim No. 2:

Change "from the stage" to --from the first stage--

Signed and Sealed this

Nineteenth Day of August, 2008

JON W. DUDAS  
*Director of the United States Patent and Trademark Office*